United States Patent [19]

Naylor et al.

[11] 4,255,769

[45] Mar. 10, 1981

[54] LOW-NOISE PREAMPLIFIER

[75] Inventors: Thomas K. Naylor, Belmont; George A. Cavigelli, Lexington, both of Mass.

[73] Assignee: American Optical Corporation, Southbridge, Mass.

[21] Appl. No.: 53,017

[22] Filed: Jun. 28, 1979

[51] Int. Cl.[3] .......................... G11B 5/45; G11B 5/02
[52] U.S. Cl. ........................................ 360/65; 360/67
[58] Field of Search ..................................... 360/67, 65

[56] References Cited

U.S. PATENT DOCUMENTS

| | | | |
|---|---|---|---|
| 3,934,267 | 1/1976 | Kosaka et al. | 360/6 |
| 4,041,538 | 8/1977 | Parker | 360/67 |
| 4,110,798 | 8/1978 | Miller et al. | 360/65 |
| 4,134,140 | 1/1979 | Wright et al. | 360/67 |
| 4,157,574 | 6/1979 | Stamer | 360/67 |

OTHER PUBLICATIONS

"Low Noise Reproducing Preamplifier for Professional Audio Recorders," Zolton Vajda, Journal of Audio Engr'. Soc., vol. 23, #1, Jan.-Feb. 1975.
"Improvements of the Noise Characteristics of Amplifiers for Magnetic Transducers," Hoettolmen et al., Jour. of the Audio Eng'r. Soc., vol. 26, #12, 12/78.

Primary Examiner—Vincent P. Canney
Attorney, Agent, or Firm—Jeremiah J. Duggan; Alan H. Spencer

[57] ABSTRACT

The preamplifier comprises amplifying means, the output of which is inverted relative to the input, and a feedback circuit connected from the output to the input of the amplifier so as to provide a perfect integrator which cancels the amplitude variations resulting from changes in tape speed. The impedance of the feedback circuit and the impedance of the signal source extended to the amplifier are such that the output of the amplifier is the integral of the voltage generated in the inductive head over a wide band of frequencies.

15 Claims, 5 Drawing Figures

LOW-NOISE PREAMPLIFIER

BACKGROUND OF THE INVENTION

The present invention relates to amplifiers and more particularly to preamplifiers for signals generated in a playback head.

Magnetic tapes containing ECG and other biological data are played back at speeded-up rates in the process of waveform monitoring/analysis, including Holter scanning. Typically the tapes will be played back at 60× and 120×. In a human ECG waveform, the real-time frequency range of interest is generally between about 0.03 Hz and 130–140 Hz; however, the low end of that frequency range at 60× is about 1.8 Hz and the upper end of that range at 120× is about 16 hKz. Characteristically the signal voltages generated in a tape playback head over which the magnetic tape passes are quite small, the actual signal voltage being on the order of microvolts and, more importantly, being a function of the frequency at which the signal is changing as it passes the head. In other words, because of the relatively wide range (i.e., 1.8 Hz–16 kHz) of frequencies encountered by the playback head, the resulting signal voltage gain will differ greatly from the low end of the frequency range to the high end, with the lower signal voltage gain appearing at the lower end of the frequency range and the higher voltage gain accordingly at the higher end of the frequency range.

It is preferable that the gain of the developed signal subsequently applied to various analytical and/or monitoring circuitry have a relatively uniform magnitude across the frequency range. While the small signals derived from the playback head might be applied to an amplifier or series of amplifiers which provided the necessary gain particularly at the low end of the frequency range, a further complication is introduced by the effects of noise inherently present in any such amplifying circuitry. More specifically, there is a type of noise known as 1/F noise which increases in density as the signal frequency decreases, yet it will be remembered that at such lower frequencies the signal voltage developed in the playback head is usually the smallest. This, therefore, leads to a situation in which the signal-to-noise ratio, particularly in the low frequency end of the band width spectrum, is intolerable.

Heretofore the prior art systems, in order to give a flat response across the frequency range, have used a plurality of selectable integrating networks connected to the output of a preamplifier in turn connected to the output of the tape playback head. The amplifier necessarily has been comprised of several stabilized amplifying units cascaded to give the needed gain and band width, followed by the integrating network selected for a particular frequency range which attenuates the amplifier output as frequency increases. This arrangement, however, is expensive, does not fully compensate for the effects of 1/F noise present in the amplifying circuitry, may be slow recovering from transient overload, and does not compensate for the stray capacitance of the head and wiring.

Therefore it is an object of the invention to provide, for signals generated in a playback head, amplifying circuitry including the playback head and capable of providing a relatively flat response over a wide frequency range and being relatively unaffected by 1/F noise in the lower portion of the signal band width.

SUMMARY OF THE INVENTION

In accordance with the present invention, there is provided a preamplifier for the small signal voltages generated in an inductive playback head by the relative motion of a magnetic recording medium, such as tape, having the signals recorded thereon passing adjacent the playback head. The preamplifier comprises amplifying means, the output of which is inverted relative to the input, and a feedback circuit connected from the output to the input of the amplifier so as to provide a perfect integrator which cancels the amplitude variations resulting from changes in tape speed. More specifically, the impedance of the feedback circuit and the impedance of the signal source extended to the amplifier are such that the output of the amplifier is the integral of the voltage generated in the inductive head over a wide band of frequencies. Typically the feedback circuit will include capacitance and resistance and the signal source circuit will include the inductance and resistance of the playback head.

Additionally, the preamplifier includes a transformer intermediate the playback head and the amplifier output for matching the signal power to the noise power. Moreover, circuit means operatively connected with the transformer serve to extend the frequency response range beyond that normally inherent in such a transformer. Specifically, bypass capacitance means extend the upper frequency response range of the signal transmission system. Furthermore, the transformer is preferably an autotransformer to economize on the total size of the transformer and further to permit extension of low and high frequency signals to the amplifier.

A base line restoration network employing biased switching means to control a non-linear resistive attenuator serves to minimize base line offset and/or rapidly return "off scale" signal levels to an acceptable level.

DESCRIPTION OF THE PREFERRED EMBODIMENTS

Figure 1:
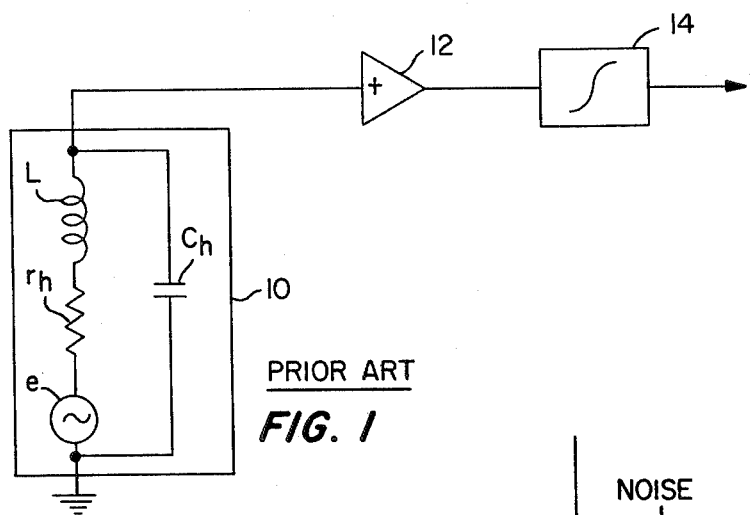
FIG. 1 is a generalized diagrammatic illustration of a prior art playback preamplifier.

FIG. 1 illustrates in a generalized diagrammatic form a prior art type of preamplifier associated with a playback head for magnetic recording media, such as magnetic tape typically employed in the playback of Holter-type electrocardiographic (ECG) recordings. Typically such Holter-type recordings are made at very slow speed, a single cassette normally containing 24 hours of a patient's ECG signals. Further, the tape is typically played back for input to a cathode ray tube scanner and/or other display, analytical and/or recording equipment at a rate substantially faster than that at which recorded. Playback rates of 60 and 120 times the record rates are typical.

A playback head is represented generally by the box 10 in FIG. 1 and more specifically includes a multi-turn inductive winding L having an internal series resistance $r_h$. As the tape having ECG signals recorded thereon is relatively moved past the playback head 10, it induces in the playback head circuit a signal voltage represented as e in FIG. 1. It will be understood that a particular recorded signal passing the playback head 10 at a particular speed will induce in the playback head a signal voltage e of a particular magnitude whereas if the tape passes the head 10 at a faster speed the signal voltage e developed in the head 10 will be of a greater amplitude but of shorter duration than for the lower speed. This in effect means that the signal voltage developed in playback head 10 is the derivative of the signal recorded on the tape, which derivative is a function of the tape speed past the head.

Figure 2:
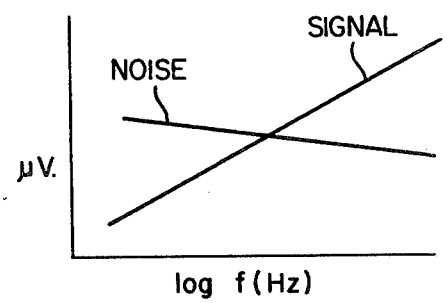
FIG. 2 is a plot of playback head signal magnitude and amplifier circuit noise magnitude as a function of frequency determined by playback speed.

FIG. 2 depicts this relationship in which the signal voltage, which was recorded as a constant level on the tape, is shown to increase as its frequency and/or the speed of the tape past head 10 increases.

A capacitance $C_h$ associated with playback head 10 and wiring appears across L, $r_h$ and e, and loads the input to amplifier 12 at high frequency.

The prior art has conventionally used one or generally several stages of amplification 12 for amplifying the signal received from the playback head 10 in order to give the necessary degree of amplification to the signal. Moreover, because the amplitude of the signal increases as the rate of playback increases, and because it is desirable for the output of the preamplifier to be as flat as possible over the frequency range of interest, the output of amplifier 12 is relatively attenuated by integrating circuitry 14 as the frequency increases. While this may result in a generally satisfactory response, it requires a plurality of cascaded amplifiers and/or a plurality of discrete integrator circuits which are individually suited only to frequency ranges less than the entire frequency range of interest and which require selection based on the tape playback speed.

In the analysis of human ECG signals in a system having high speed playback factors of 60× and 120×, the low end of the frequency range of interest at the high speed playback rates will be represented by 60 times 0.03 Hz=1.8 Hz and the upper end of the frequency range will be represented by 120 times about 130–140 Hz which equals about 16 kHz. Such a range is at least ten times greater than that usually possessed by an audio amplifier and thus the need for multiple-amplifier stages 12 in the prior art. The term "wide range" as used herein will be used to denote the frequency range which begins at somewhat less than 2 Hz and extends up to or beyond 16 kHz.

Figure 3:
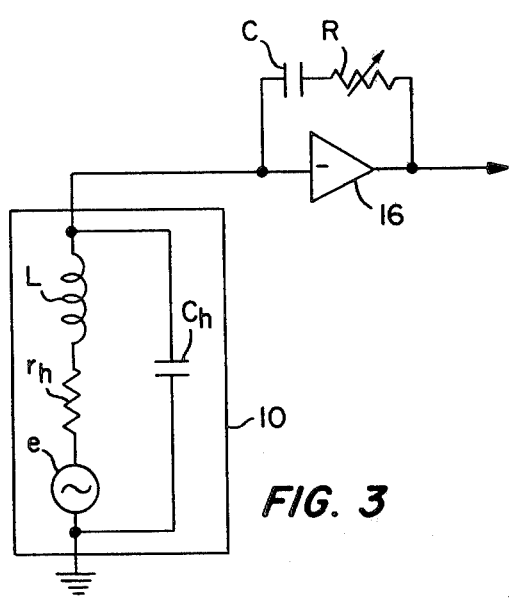
FIG. 3 is a generalized diagrammatic illustration of the playback preamplifier of the invention.

In accordance with the present invention, and in lieu of the several stages of amplification and several following selectable integrators of the prior art, there is provided a preamplification circuit represented by the block diagram of FIG. 3 in which an amplifier 16 has the output of playback head 10 extended to the input thereof and further includes the provision of particular negative feedback from the output of amplifier 16 to its input. More specifically still, the impedance of the feedback circuit and the impedance of the signal source represented by playback head 10 are selected such that the output of the amplifier is the integral of the voltage generated in the inductive head over a wide band of frequencies. The amplifier 16 illustrated in FIG. 3 may be representative of a plurality of stages of amplification, active and/or passive, with the output being inverted relative to the input.

Classically, in an amplifying circuit employing negative feedback and in which an input resistance is represented as $Z_1$ and a negative feedback impedance is represented as $Z_2$, the output voltage is represented as the negative of the input voltage times the ratio of $Z_2$ to $Z_1$. Extending this to the simplified circuit of FIG. 3, for input signal frequencies below about 200 Hz, the feedback impedance will be represented substantially only by the capacitor and the input impedance substantially only by the playback head resistance $r_h$. Therefore, the output signal is represented by the expression $$-e_{in} \frac{\left(\frac{1}{CS}\right)}{Z_1 = r_h},$$

which may be further expressed as $$\frac{1}{r_h C} \frac{1}{(S)} e_{in}.$$

This, it will be appreciated, is the expression for a perfect integrator multiplied by a constant, $1/r_h C$. For frequencies greater than about 200 Hz, the feedback impedance will be represented principally only by the resistance R and the imput impedance will be represented by the inductance L such that the output voltage $$e_o = -e_{in} \frac{R}{LS}$$

which in turn equals $$\frac{-R}{L} \left(\frac{1}{S}\right) e_{in}.$$

It will be appreciated that this expression also represents a perfect integrator multiplied by a constant, R/L. The integrating effects of this circuit will be substantially the same above, at and below the area of 200 Hz if $1/r_h C$ equals R/L.

Thus the preamplifier may be termed an integrating preamplifier, with the integration provided by means of a resistive-capacitive feedback circuit and a resistive-inductive input circuit. The desired integrating effect across the 2 Hz–16 kHz range is best achieved, as discussed above, by making $r_h C$ equal, or about equal, to L/R. In most instances, the values of capacitance C and resistance R will be determined by the inductance L and the internal resistance $r_h$ of the particular playback head selected for use.

A further advantage resides in the fact that the capacitance $C_h$ associated with the playback head 10 no longer affects the loading of the head at high frequencies, because now it sees a virtual ground at the summing junction at the input to amplifier 16 and therefore takes negligible current from head 10.

Figure 4:
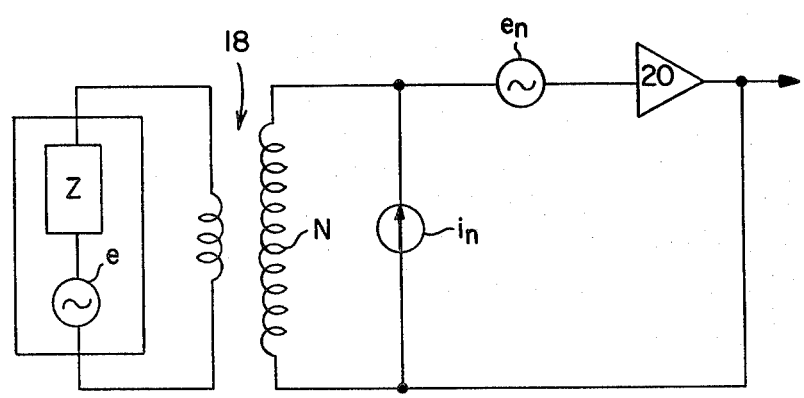
FIG. 4 is another generalized diagrammatic illustration of the playback preamplifier of the invention.

Referring to another aspect of the invention, FIG. 2 illustrates the effects of 1/F noise as a function of frequency. Such noise normally arises in the amplification circuitry itself rather than in the input signal prior to its application to the amplification circuitry. It will be observed that the amplitude of such noise may be so great in the lower frequency ranges as to exceed the strength of the input signal itself, creating an intolerable situation. It is normally desirable to have the signal-to-noise ratio as large as possible, with the signal amplitude at least being greater than that of the noise. Accordingly, a transformer 18 is illustrated in the circuit of FIG. 4 for stepping up the signal voltage without proportionally introducing a stepped-up voltage noise as would be occasioned by an active amplifier. However, the use of transformer 18 does result in an increase in the current noise introduced by the active amplifier 20 necessarily present in the circuit for power gain.

It should be understood that in the idealized circuit of FIG. 4, the transformer 18 and amplifier 20 together comprise the amplifier 16 of FIG. 3 and the impedance Z of playback head 10 comprises the inductance L and resistance $r_h$ of FIG. 3, the feedback network of FIG. 3 having been omitted from FIG. 4. In the circuit of FIG. 4, the transformer 18 possesses a step-up turns ratio of N:1, or in other words, N. The amplifier 20 is the source of a voltage noise component $e_n$ and a current noise component $i_n$ including the 1/F type. The signal generated by the playback head 10 is represented as e and thus the signal-to-noise (S/N) ratio may be expressed as $$\frac{e}{e_n + i_n Z}.$$

The component $i_n Z$ represents that noise voltage caused by the current noise $i_n$ passing through the impedance Z as if no transformer 18 were present. However, the presence of step-up transformer 18 having a step-up ratio of N causes the signal voltage seen in the secondary side to have a value of Ne and the voltage component resulting from the current noise $i_n$ passing through the impedance Z reflected to the secondary to have the value $N^2 Z i_n$. This latter expression results from the fact that the impedance Z as seen at the secondary side of transformer 18 is increased by the square of the turns ratio N. Accordingly, the earlier expressed signal-to-noise ratio may now be expressed $$S/N = \frac{Ne}{e_n + N^2 Z i_n} = \frac{e}{\frac{e_n}{N} + N i_n Z}.$$

From this expression it will be appreciated that as the turns ratio of transformer 18 increases, the signal-to-noise ratio based solely on the voltage noise $e_n$ improves; however, it will be further appreciated that such increase in the turns ratio causes a corresponding increase in the noise voltage occasioned by the current noise $i_n$, thereby offsetting the signal-to-noise gain. In view of the foregoing analysis and in accordance with an aspect of the invention, the active circuit elements of amplifier 20 are selected to be the type inherently having as small current noise $i_n$ as possible. More specifically, the active amplifier 20 will preferably employ junction field effect transistors (JFET's) which have a particularly low current noise characteristic, as well as a low noise operational amplifier.

In accordance with a further aspect of the invention illustrated in the detailed circuitry of FIG. 5 to be hereinafter described, the generalized transformer 18 of FIG. 4 preferably comprises an autotransformer for the purpose of economizing on space and materials and providing a low frequency and high frequency connection between the playback head 10 and the following amplification circuitry. At or near DC, the primary and secondary of the autotransformer become connected resistors. At high frequencies where the response of a conventional transformer would be greatly deteriorated, the autotransformer at least has unity gain.

Figure 5:
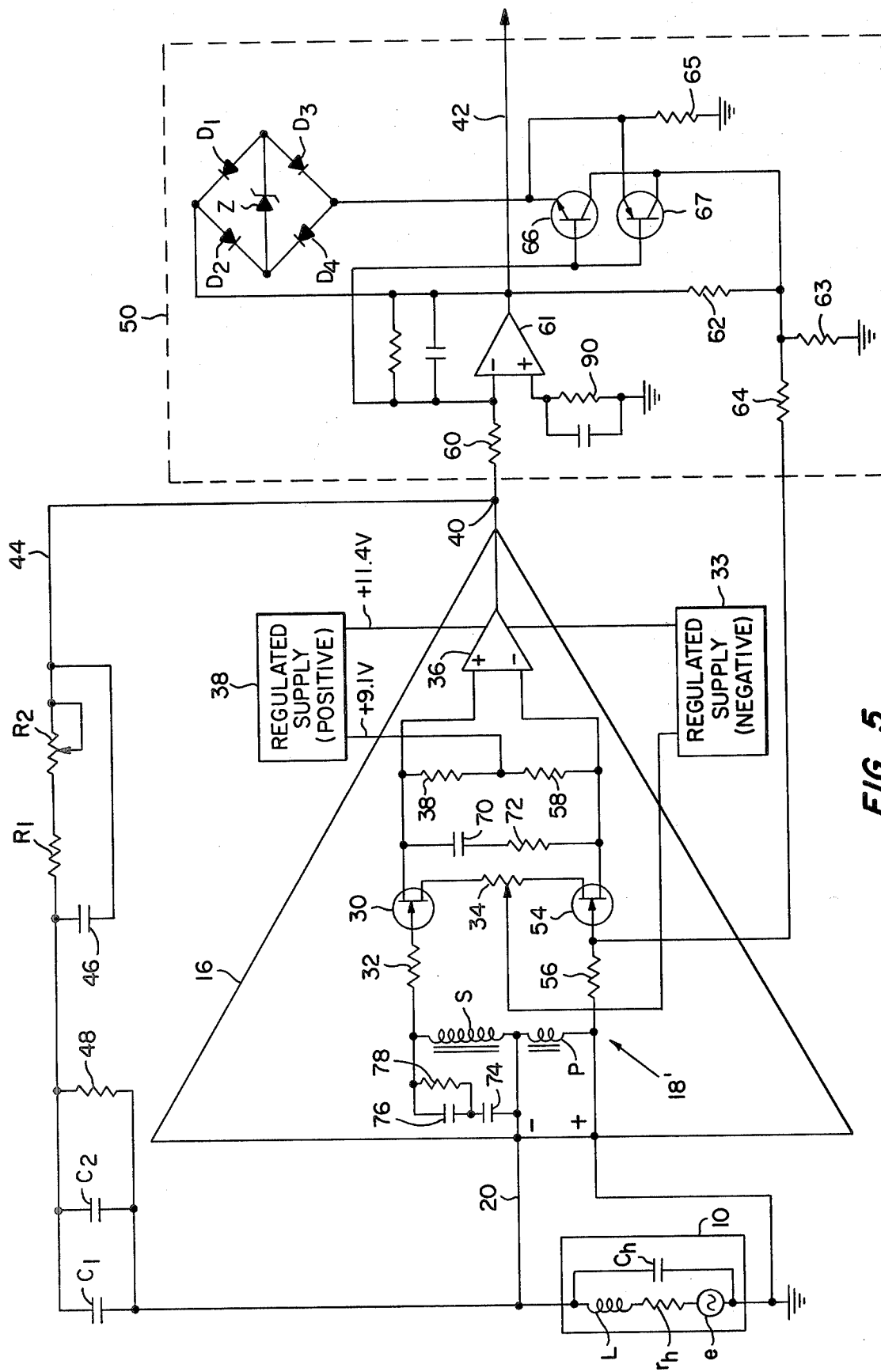
FIG. 5 is a detailed circuit diagram of the playback head preamplifier of the invention.

Reference is now made to the circuit of FIG. 5 which comprises a detailed and specific embodiment of an integrating preamplifier in accordance with the invention and embodying the features and principles of the idealized equivalent circuits heretofore discussed. The playback head 10 and the overall preamplifier 16 in FIG. 5 correspond exactly with the similarly numbered elements of FIG. 3. The autotransformer 18' of FIG. 5 generally corresponds with the transformer 18 of FIG. 4. Further, resistors $R_1$ and $R_2$ and capacitors $C_1$ and $C_2$ of FIG. 5 generally correspond with resistance R and capacitance C respectively of FIG. 3.

As a magnetic tape (not shown) containing ECG signals from a patient is transported rapidly past playback head 10, i.e., at 60 or 120 times the speed at which recorded, an ECG signal voltage e is induced in the windings L of the playback head and is conducted to the inverting input of preamplifier 16 via input conductor 20. The other end of playback head 10 is grounded, as is the non-inverting input of preamplifier 16. The signal voltage e is applied to the primary P of voltage step-up autotransformer 18' having a turns ratio of primary P and secondary S to primary P (i.e., P+S:P) of about 13:1.

The stepped-up voltage of signal e is applied to the input or gate of a junction field effect transistor (JFET) 30 via offset compensating resistor 32 from the transformer secondary S. The JFET 30 is selected for its characteristic as a low gain (i.e., ×10–15) amplifier which introduces but a very low component of current noise ($i_n$) to the circuit. The source electrode of JFET 30 is connected to a highly regulated, non-reversing negative supply 33 via part of balancing resistor 34. The output from the drain electrode of JFET 30 is developed across load resistor 38 and is extended to the non-inverting input of a low noise operational amplifier 36. The JFET 30 is an inverting amplifier.

The operational amplifier 36 receives positive and negative supply voltages from highly regulated, non-reversing positive voltage and negative power supplies 38 and 33 respectively. The operational amplifier 36 has a gain factor ranging from about 30,000 at DC to 60 at 15 kHz.

The output from amplifier 36 appears at junction 40 where it is extended, via conductor 42, to further amplification and signal processing circuitry (not shown) in accordance with Holter-type signal processing.

The output of operational amplifier 36, and thus preamplifier 16, is also extended, via feedback conductor 44 through resistance $R_1$ and $R_2$ and capacitance $C_1$ and $C_2$, to the summing junction at the inverting input of the preamplifier 16. Resistances $R_1$ and $R_2$ are in series, with $R_1$ having a value of 34.8 kohm and $R_2$ being a variable 100 kohm resistance. A capacitor 46 shunts series resistors $R_1$ and $R_2$ to provide high frequency stability.

Capacitors $C_1$ and $C_2$ are in parallel with one another and in series with resistors $R_1$ and $R_2$. Capacitance $C_2$ is 13.7 nF and capacitance $C_1$ is selected based on the inductance L and resistance $r_h$ of head 10, as is the resistance setting of resistor $R_2$ so as to generally satisfy the relationship $1/r_h C = R/L$, where $C = C_1 + C_2$ and $R = R_1 + R_2$. A large resistor 48 is also in parallel with capacitances $C_1$ and $C_2$ for controlling offset at DC.

The resistive and capacitive feedback network results in preamplifier 16 being an integrating preamplifier such that the output signal on conductor 42 experiences a relatively constant gain across the wide range of frequencies required, and the signal-to-noise ratio is adequate. This response is obtained without the need for multiple cascaded stabilized amplifiers followed by a selectively variable integrating network.

In accordance with another aspect of the invention there is provided base line restoration circuitry generally designated 50, which is connected in a feedback path from output 40 of preamplifier 16 to the gate electrode of a second JFET 54. The JFET 54 gate is also connected to ground through attenuator and offset compensating resistor 56. The source electrode of JFET 54 is connected to negative supply 33 via the remaining part of balancing resistor 34 and the output from the drain electrode is developed across load resistor 58 and is extended to the inverting input of operational amplifier 36. Resistors 38 and 58 are preferably identical for balance.

The base line restoration circuitry 50 includes an inverting amplifier 61 having a serial resistor 60 connected to the inverting input thereof from the output 40 of preamplifier 16. The non-inverting input of inverting amplifier 61 is referenced to ground through resistor 90. The output of inverting amplifier 61 provides feedback to the gate of JFET 54 of preamplifier 16 via a cascaded, non-linear resistive attenuator. The attenuator includes, in the normal instance, a first attenuator comprised of voltage-dividing resistors 62 (274 kohm) and 63 (1 kohm), and a second attenuator in cascade with the first and comprised of voltage-dividing resistors 64 (274 kohm) and 56 (1 kohm), in which one end of resistor 64 is connected to the junction of resistors 62 and 63 and the other end is connected to the gate of JFET 54.

A resistive base line restoration network is provided, rather than the more conventional integrating restoration network, because in the present instance the preamplifier 16 is already an integrating preamplifier. For "normal" small amplitude, slow rate signal offsets or excursions of the base line, the inverter 61 inverts the output of preamplifier 16 and feeds back a greatly attenuated portion of that output to the gate of JFET 54 (inverting), the output of which is connected to the inverting input of operational amplifier 36. This provides the normally-needed correction signal.

However, the network 50 also includes a biased switching network for more rapidly restoring the base line for large scale, usually rapid, offsets exceeding some threshold voltages. Specifically, the output of inverting amplifier 61 is extended to a diode bridge comprise of diodes $D_1$, $D_2$, $D_3$ and $D_4$, which bridge is spanned by Zener diode Z. The value of the Zener diode is selected to be about 3.5 volts such that conduction occurs through an appropriate two of diodes $D_1$–$D_4$, the Zener Z, and the base-emitter junction of one or the other of two complementary, low-leakage transistors 66 and 67 when the voltage from inverter 61 exceeds ±5 volts. The emitters of transistors 66 and 67 are also connected to a leakage draining resistor 65 having its other end connected to ground.

When either transistor 66 or 67 conducts, its base circuit provides current to a summing junction at the inverting input of inverting amplifier 61 so as to clamp the output 42 from amplifier 61 such that any display or the like remains on scale. Also, a compensating capacitor 68 and gain resistor 69, in shunt with one another, extend from the output of inverter 61 to the summing junction at its inverting input in a known manner.

Importantly, also, conduction of either transistor 66 or 67 serves, via its collector-emitter circuit, to effectively short-circuit the large resistor (274 kohm) 62 of the first attenuator, such that only the second attenuator of resistors 64 and 56 remains. In such instance, instead of the feedback restoration signal being only $1/(274)^2$ of the output of the amplifier, it is 1/274 of the amplifier output, thereby much more rapidly effecting the desired restoration of the base line. In this way, the resistive attenuator is said to be non-linear, having one attenuation value for outputs within the ±5 V. threshold of the biased switching network and another for outputs outside that value. It will also be appreciated that the inverting amplifier 61 contributes still further gain to the preamplifier 16, which output finally appears at 42.

A stabilization network comprised of capacitor 70 in series with resistor 72, both being connected across the inputs to operational amplifier 36, serves to prevent oscillation of preamplifier 16 at high frequencies.

For flat response of autotransformer 18, series-connected resistor 78 and capacitor 74 shunt the transformer secondary S. The resistor 78 terminates the transformer secondary S above about 700 Hz, as determined by capacitor 74. Capacitor 76, connected in shunt with resistor 78, bypasses the transformer at high frequency to maintain system stability.

The present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A preamplifier for small signals generated in an inductive playback head by relative motion between the playback head and a magnetic recording medium having the signals recorded thereon, comprising amplifying means having an input and an output, means for extending the small signal from the playback head to said amplifying means input, feedback means connected from said output to said input of said amplifying means for providing negative feedback of a portion of the signal applied to said input, said feedback means being operative to provide at said amplifying means output the integral of the signal within said playback head; and base line restoration means operatively connected in negative feedback relationship with said amplifying means, said base line restoration means including a non-linear resistive attenuator, said non-linear resistive attenuator having a plurality of stages of attenuating resistance in cascading relationship and biased switching means operatively connected to at least one of said stages of attenuating resistance for effectively bypassing said at least one stage of attenuating resistance from said plurality as a function of the magnitude of the output signal from said amplifying means.

2. The preamplifier of claim 1 wherein said feedback means includes a feedback impedance, said playback head comprises an inductance and a resistance comprising at least part of an input impedance to said amplifying means, and said feedback impedance and said input impedance being operative to integrate the voltage generated in the playback head over a wide frequency band.

3. The preamplifier of claim 2 wherein said wide frequency band includes at least the frequency range extending from about 1.8 Hz to about 16 Khz.

4. The preamplifier of claim 1 wherein said feedback means includes a feedback impedance, said playback head comprises an inductance and a resistance comprising at least part of an input impedance to said amplifying means, and said feedback impedance and said input impedance being scaled such that the output of said amplifying means is the integral of the voltage generated in the playback head over a wide frequency band.

5. The preamplifier of claim 2 wherein said amplifying means includes an autotransformer.

6. The preamplifier of claim 5 wherein said amplifying means further includes active amplifying means having its input operatively connected to the secondary of said autotransformer.

7. The preamplifier of claim 6 wherein said autotransformer is a voltage step-up transformer.

8. The preamplifier of claim 5 wherein said amplifying means further includes a junction field effect transistor having its gate electrode operatively connected to the secondary of said autotransformer thereby to minimize the current noise in said circuit.

9. The preamplifier of claim 4 wherein said feedback impedance comprises a capacitance and a resistance.

10. The preamplifier of claim 9 wherein $r_h C$ approximately equals $L/R$, where $r_h$ is the internal resistance in ohms of the playback head, C is the capacitance in microfarads in said feedback means, L is the inductance in henrys of said playback head, and R is the resistance in ohms in said feedback means.

11. The preamplifier of claim 1 wherein said magnetic recording medium is magnetic tape.

12. The preamplifier of claim 1 wherein said biased switching means comprises semiconductor threshold switching means responsive to the voltage of the signal appearing at the output of said amplifying means exceeding a particular voltage threshold value for effectively short-circuiting said at least one stage of attenuating resistance.

13. The preamplifier of claim 12 wherein said semiconductor threshold switching means comprises a diode bridge operatively connected to said amplifying means output, a Zener diode spanning said bridge, and complementary pair of transistors operatively connected to said bridge, the emitter-collector circuits of said transistors being series-connected with said bridge, and each said transistor emitter-collector circuit being connected in parallel with said at least one stage of attenuating resistance for conduction when said particular voltage threshold value is exceeded.

14. The preamplifier of claim 1 further including over-voltage clamping means operatively connected to the output of said amplifying means, said over-voltage clamping means comprising an inverting amplifier operatively connected to the output of said amplifying means, second negative feed back means connected from the output to the inverting summing junction of said inverting amplifier and biased switching means operatively connected to the output of said inverting amplifier and in shunt with said second negative feedback means for effectively bypassing said second negative feedback means when the voltage of the signal appearing at the output of said inverting amplifier exceeds a particular threshold value thereby to minimize the incremental gain of said inverting amplifier.

15. The preamplifier of claim 14 wherein said biased switching means comprises a diode bridge operatively connected to the output of said inverting amplifier, a Zener diode spanning said bridge, and a complementary pair of transistors operatively connected to said bridge, the emitter-base circuits of said transistors being series connected with said bridge, the respective bases of said transistors being operatively connected to the inverting summing junction of said inverting amplifier.

* * * * *